US006661690B2

(12) United States Patent
Moriarty et al.

(10) Patent No.: US 6,661,690 B2
(45) Date of Patent: Dec. 9, 2003

(54) HIGH CAPACITY MEMORY MODULE WITH BUILT-IN PERFORMANCE ENHANCING FEATURES

(75) Inventors: Sharon L. Moriarty, Mountain View, CA (US); Zineng Fan, Santa Clara, CA (US); Dirk D. Brown, Sunnyvale, CA (US); Che-Yu Li, Ithaca, NY (US)

(73) Assignee: High Connection Density, Inc., Sunnyvale, CA (US)

(*) Notice: Subject to any disclaimer, the term of this patent is extended or adjusted under 35 U.S.C. 154(b) by 55 days.

(21) Appl. No.: 10/077,057

(22) Filed: Feb. 19, 2002

(65) Prior Publication Data

US 2003/0156443 A1 Aug. 21, 2003

(51) Int. Cl.$^7$ ................................ G11C 5/26
(52) U.S. Cl. ............................ 365/63; 365/52
(58) Field of Search ........................... 365/63, 52

(56) References Cited

U.S. PATENT DOCUMENTS

| | | | |
|---|---|---|---|
| 6,172,895 B1 | 1/2001 | Brown et al. | 439/66 |
| 6,264,476 B1 | 7/2001 | Li et al. | 365/63 |
| 6,381,164 B1 * | 4/2002 | Fan et al. | 365/51 |
| 6,477,592 B1 * | 11/2002 | Chen et al. | 710/52 |
| 6,510,503 B2 * | 1/2003 | Gillingham et al. | 711/167 |
| 6,535,411 B2 * | 3/2003 | Jolin et al. | 365/52 |
| 6,540,525 B1 * | 4/2003 | Li et al. | 439/66 |

OTHER PUBLICATIONS

U.S. patent application Ser. No. 09/835,123, Fan et al., filed Apr. 13, 2001.
U.S. patent application Ser. No. 09/932,525, Li et al., filed Aug. 17, 2001.

* cited by examiner

Primary Examiner—Richard Elms
Assistant Examiner—Tuan T. Nguyen
(74) Attorney, Agent, or Firm—Salzman & Levy

(57) ABSTRACT

A memory module with any combination of driver line terminators, power supply circuits, and components integral to a memory control subsystem mounted directly on the memory module for use with high speed, impedance-controlled memory buses. The memory module may be formed on a conventional printed circuit card with unpacked or packed memory chips attached directly to the memory module. Including the additional functionality directly on the memory modules improves the EMC/EMI performance as well as signal quality and integrity, thereby enhancing the memory subsystem performance. Such designs may also eliminate the need for bus exit connections, thereby allowing the freed-up connection capacity to be used to address additional memory capacity on the module. Another embodiment features a module with the additional features but without memory devices.

34 Claims, 11 Drawing Sheets

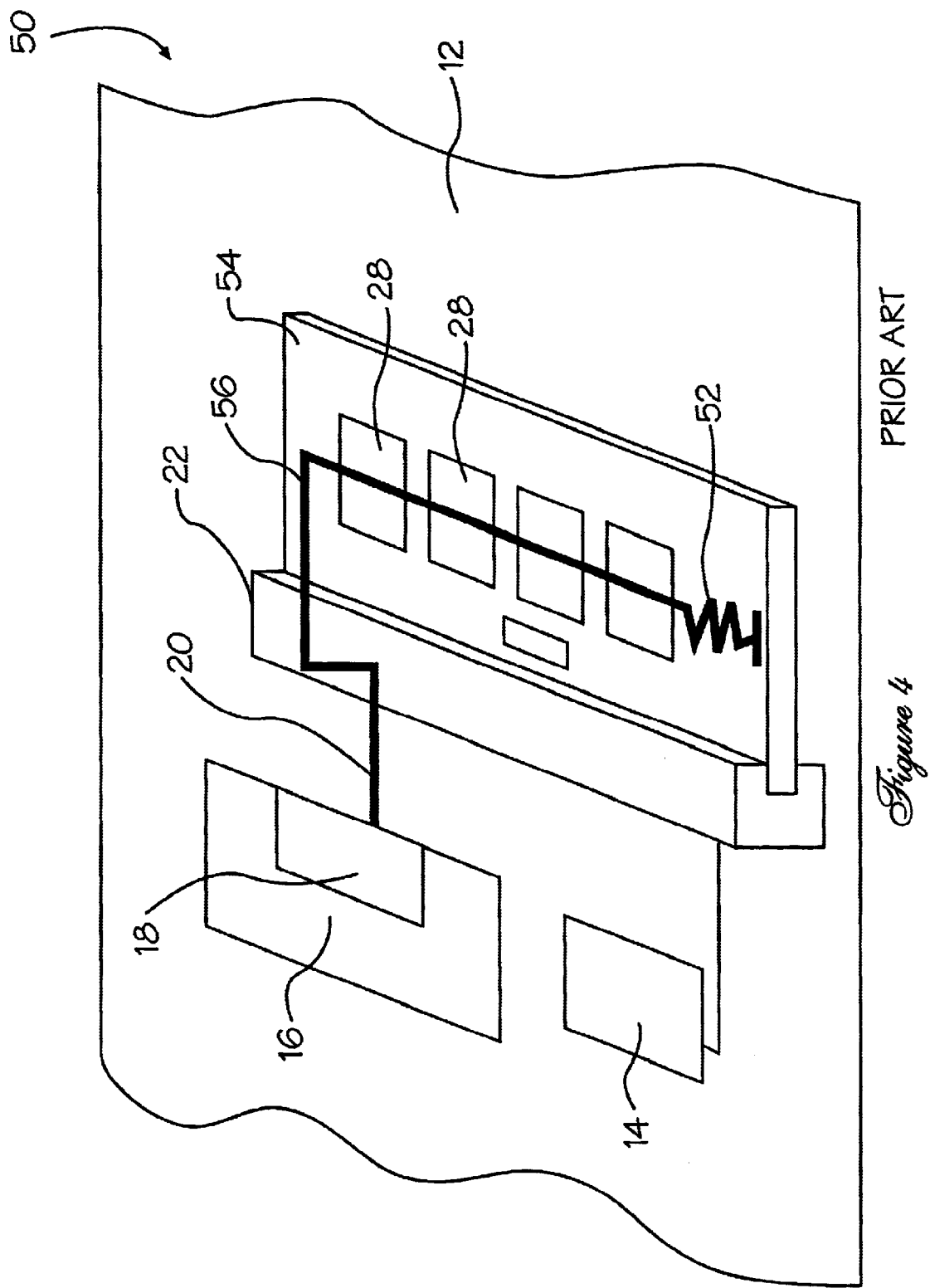

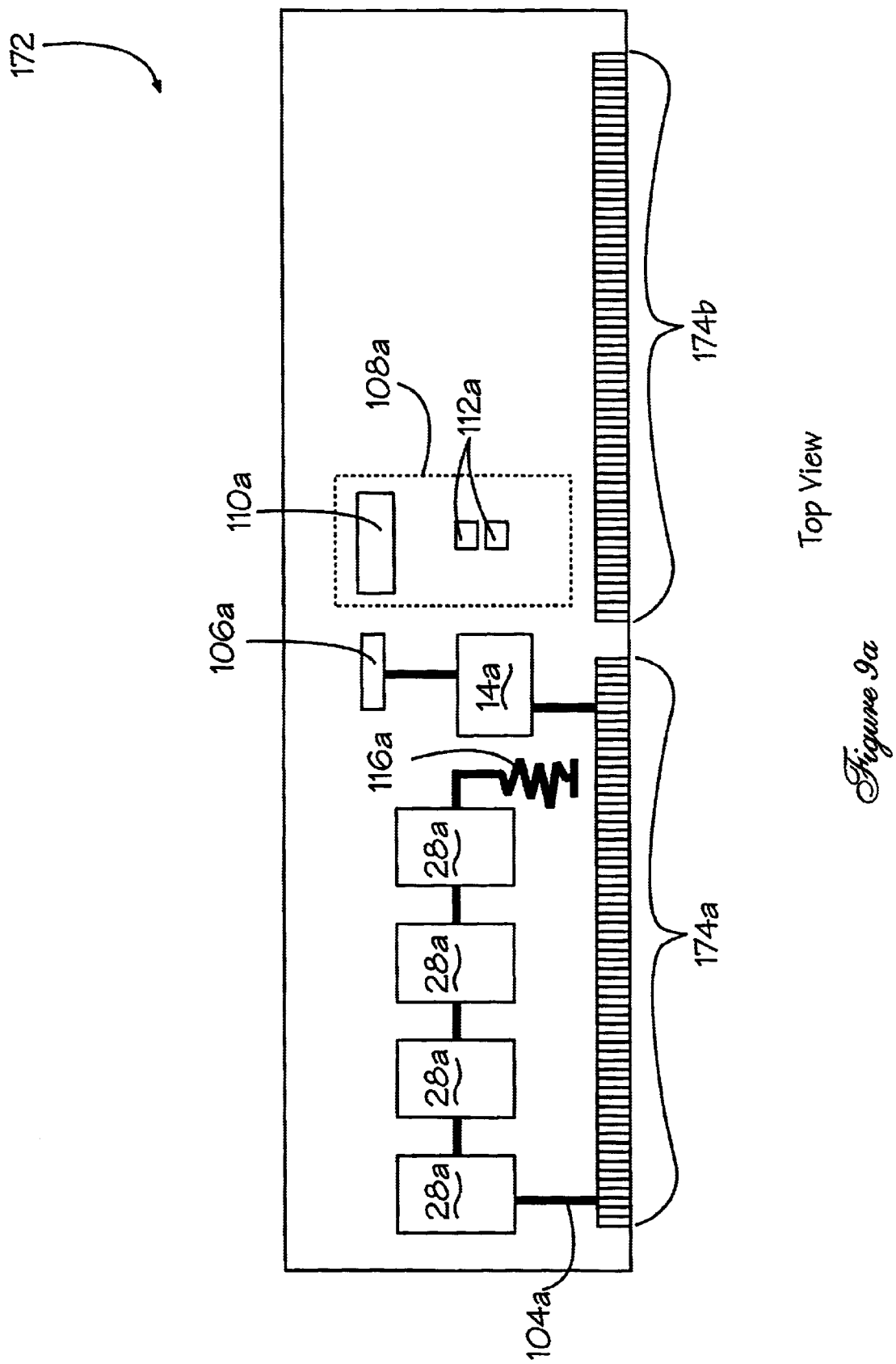

HIGH CAPACITY MEMORY MODULE WITH BUILT-IN PERFORMANCE ENHANCING FEATURES

RELATED PATENT APPLICATIONS

This application is related to U.S. Pat. No. 6,264,476, issued to Li et al. for WIRE SEGMENT BASED INTERPOSER FOR HIGH FREQUENCY ELECTRICAL CONNECTION, to U.S. Pat. No. 6,172,895, issued to Brown et al. for HIGH CAPACITY MEMORY MODULE WITH BUILT-IN HIGH-SPEED BUS TERMINATIONS, to U.S. patent application Ser. No. 09/835,123, filed Apr. 13, 2001 now U.S. Pat. No. 6,381,164, issued to Fan et al. and to U.S. patent application Ser. No. 09/932,525, filed Aug. 17, 2001, now U.S. Pat. No. 6,540,525 issued to Li et al. all of which are hereby incorporated by reference.

FIELD OF THE INVENTION

The present invention relates to termination and high-density memory modules for computer applications and, more particularly, to termination and high-density memory modules having impedance-controlled transmission line buses and, optionally, driver line terminators, power supply circuits, and portions of a memory controller built into the modules.

BACKGROUND OF THE INVENTION

Modern, high speed digital computers and the sophisticated software running on them require ever-increasing amounts of volatile random access memory (RAM). As bus and clock speeds increase, the electrical drive requirements for servicing a number of memory devices become much more stringent than when slower memory was in use.

The operating speed of a memory system is largely determined by the electrical interconnections between the memory controller and the memory devices, or the bus. As the data rate increases, the signal propagation times through the interconnections are no longer negligible compared to the transition time of the signals. At high bus speeds, those interconnections behave as transmission line networks. The response characteristics of such transmission line networks define the maximum usable speed of the memory bus.

In the current generation of memory packaging technology, the amount of memory physically available on a single card or module is controlled by two factors: the capacity of the memory devices (chips) themselves and the number of electrical connections that physically may be made to the module. The number of cards or modules which may be daisy chained is dependent on what a particular architecture can support. For example, Rambus technology can support up to 32 devices. To ensure fast memory cycle times, extremely short, fast rise pulses are used.

For example, in conventional synchronous dynamic random access memory (SDRAM) systems, because only one bit can exist on the bus during a certain time interval, the bus speed is determined mainly by the minimum signal setup and hold times of the bus. As a result, the highest data rate that such a bus can currently achieve in PC memory systems is 266 Mbits per second. Usually, no impedance-matching termination is required or provided in such a conventional RAM system.

To achieve even higher bus speeds and, at the same time, allow for larger memory capacities, impedance controlled types of buses must be adopted. For example, RAMBUS technology features a memory configuration wherein memory devices are disposed (packaged) on up to three RAMBUS Inline Memory Module (RIMM) cards all interconnected on a system board by a high speed data bus. One or more termination components are placed on the system board at the physical end of the bus.

In operation, address/data lines leave driver circuits on the system board and enter a first RIMM card in the memory chain. These same address/data lines must leave the RIMM via a complete, second set of connections. This routing continues through a second and third RIMM module before the driver lines reach their terminations. This memory/bus configuration allows very fast transition signals, to be transmitted between a memory controller and a data storing device over relatively long buses. These buses allow multiple bits to propagate simultaneously down each line of the bus, thereby achieving effective data bit rates of 1066 Mbits per second. Even higher data bit rates appear feasible in the future.

One most important feature of such buses is that the effective impedance of the signal propagation paths is well controlled, and one end of the bus is terminated to the characteristic impedance of the bus in order to maintain signal integrity.

In systems adopting such buses, the amplitude of the driving signals are generally much smaller than amplitudes of conventional digital signals. This is due to the limitation on the driving strength (dv/dt) of the devices.

All of the above mentioned factors make the reliable operation of such memory buses dependent upon controlling the impedance of the interconnections along the bus. Any impedance mismatches along the signal transmission path result in signal degradations which, in turn, may lead to errors in data transmissions. At the same time, maintenance of accurate timing among all of the signal bits and clocks is also critical to reliable data transmission. For this reason, minimizing signal-to-clock delay difference (data to clock skew) is another important requirement for such buses.

Prior art memory system designs generally consist of a memory controller, a clock driver and bus terminations all mounted on the system board with up to three memory slots between the controller and the termination. The data signals must pass through every module and also through a total of six edge connectors before they reach the termination. Because of their design, current edge connectors introduce impedance mismatches and crosstalk, which degrade signal quality and therefore limit the performance of the signal channels.

The inclusion of the terminations on the memory modules themselves also provides several types of performance improvement. First, because only a single set of contacts need be used (i.e., there is no need to have the bus lines exit the module), the additional contact capacity may be devoted to addressing capability for even greater amounts of memory on a single card or module. By eliminating essentially half of the required contacts, an even greater number of chips (e.g., 64 chips) may be packaged on a single card.

Total bus path length is significantly reduced because more memory may be placed on a single card physically much closer to the driver circuits than has heretofore been possible. Even more improvement is obtained because the extra passage of signals through exit contacts is eliminated. Also eliminated is that portion of the bus path between the memory modules and the external terminator resistors of the prior art.

That design may reduce the design complexity and manufacturing cost of the system board. For memory systems having one to three memory modules, using a terminated module as the last module helps to achieve maximum system performance.

In addition to the inclusion of termination components such as a network of resistors and capacitors on the module, the inventive modules would benefit from the inclusion of a power supply and any additional filtering components required to power the termination network, since the RIMM connector specification does not designate the contact(s) necessary for the termination voltage.

The present invention also allows integration of all of the memory chips that a channel can have onto a single, terminated module, which leads to better system integrity and lower cost. The inventive, self-terminated module needs only half of the I/O connections of a conventional module of the prior art. Using a conventional prior art connector on a module, two channels of memory can be integrated onto one module, which yields increased throughput.

Prior art RAMBUS-based memory subsystems place support circuitry needed for implementation of the RAMBUS memory on the system board. This includes a Direct RAMBUS Clock Generator (DRCG) circuit and a master device containing a Direct RAMBUS ASIC Cell (DRAC). The DRCG device and all of its associated components generate a CTM/CTMN# differential pair. Since the CTM/CTMN# differential pair operates at such a high frequency and is normally driven counter to the RAMBUS channel, many routing restrictions for these printed circuit traces are required. For example, lengths of the printed circuit traces of the two nets must be matched within ±0.005 inch. Failure to follow these requirements affects memory subsystem operation.

While the prior art approach works adequately, the inclusion of the DRCG device and all of its associated components on a module, rather than on the system board has several benefits. When the CTM/CTMN# differential pair of the DRCG circuit is driven from the module, the three input clocks to the DRCG circuit: PCLK/M, SYNCLK/N, and REFCLK all operate at significantly lower frequencies, thereby simplifying the routing of the printed circuit traces for these nets.

Also, since the standard RIMM connector does not include connections for signals such as the clock inputs and power supply inputs needed to operate the DRCG circuit, they can be connected to the inventive module by using some of the existing unused pins on the RIMM connector. Alternatively, it may be desirable to bring these signals in separately by placing one or more additional interface connectors on the inventive module. For the case where a module has more one than one memory channel, additional DRCG circuits, including all of the associated components that generate the CTM/CTMN# differential pairs, are required for each channel.

Therefore, compared to the aforementioned U.S. Pat. No. 6,172,895, the modules of the present invention provide improved functionality by incorporating additional components directly on the module. These items include power supply circuits and components integral to a memory control subsystem. While RAMBUS-based applications will be shown for purposes of disclosure, the concepts taught can be applied to other memory subsystems as well as to many other high speed bus-based applications.

An extension of the abovementioned circuit additions to add functionality to the module is to offer a module without memory devices. This termination module can be a valuable addition for those applications that require the use of existing, non-terminated memory modules.

It is, therefore, an object of the invention to provide a high density memory module with bus terminations provided on the memory module itself.

It is an additional object of the invention to provide a high density memory module with power supply circuitry and any additional filtering required to power the bus termination network on the memory module itself.

It is another object of the invention to provide a high density memory module with a DRCG device and its associated components provided on the memory module itself.

It is yet another object of the invention to provide a high density memory module containing memory devices for one or more bus channels.

SUMMARY OF THE INVENTION

The present invention provides a memory module with any combination of driver line terminators, power supply circuits, and components integral to a memory control subsystem mounted directly on the memory module for use with high speed, impedance-controlled memory buses. The memory module may be formed on a conventional printed circuit card with unpacked or packed memory chips attached directly to the memory module. Including the additional functionality directly on the memory modules improves the signal quality and integrity, thereby enhancing the memory subsystem performance. Such designs may also eliminate the need for bus exit connections, thereby allowing the freed-up connection capacity to be used to address additional memory capacity on the module. Another embodiment features a module with the additional features, but without memory devices.

BRIEF DESCRIPTION OF THE DRAWINGS

A complete understanding of the present invention may be obtained by reference to the accompanying drawings, when taken in conjunction with the detailed description thereof and in which:

FIG. 2b is a top view of the prior art memory card shown in FIG. 2a;

FIG. 2c is a side view of the prior art memory card shown in FIG. 2a;

FIG. 4 is a block diagram representation of a single-card memory arrangement of the prior art with bus termination on a memory card;

FIG. 8b is a cross sectional, enlarged view of the memory arrangement as shown in FIG. 8a; and FIGS. 9a and 9b are front and back block diagrams of the memory module taught in FIG. 6 including a second memory channel.

DETAILED DESCRIPTION OF THE PREFERRED EMBODIMENT

Generally speaking, the present invention provides a memory module with any combination of driver line terminators, power supply circuits, and components integral to a memory control subsystem mounted directly on the memory module for use with high speed, impedance-controlled memory buses. The memory module may be formed on a conventional printed circuit card with unpacked or packed memory chips attached directly to the memory module. Such designs may also eliminate the need for bus exit connections, thereby allowing the freed-up connection capacity to be used to address additional memory capacity on the module. Another embodiment features a module with the additional features, but without memory devices.

Figure 1:
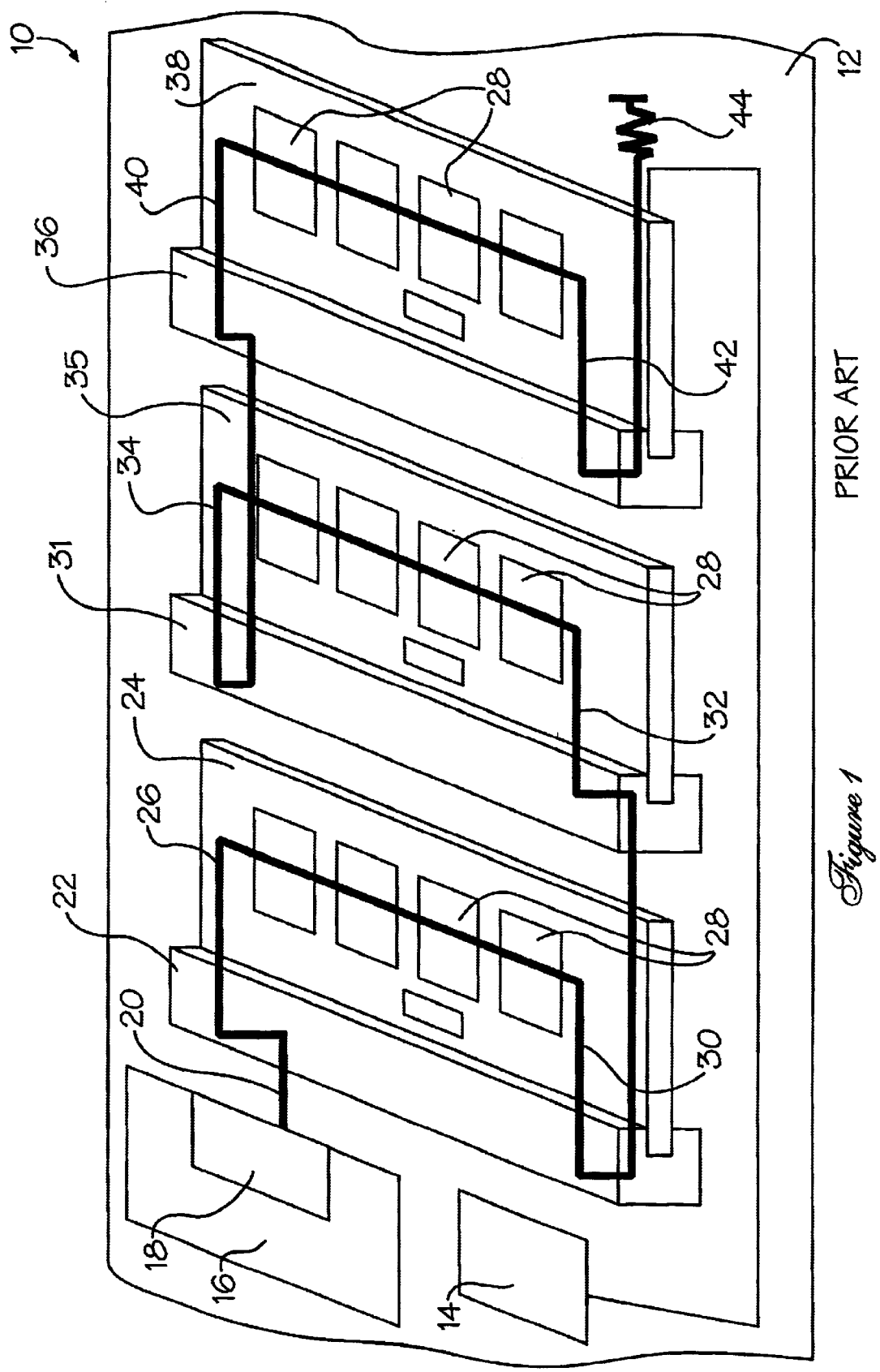
FIG. 1 is a block diagram of a multi-card memory arrangement of the prior art with bus termination on the system board.

Referring first to FIG. 1, there is shown a block diagram of a multi-card (three-card) memory system 10 of the prior art. Conventional two-slot and three-slot boards required terminations on the system board 12, which were needed even when all slots were not used. Of course, in that situation, signal quality could be degraded by the module connectors, which provide signal paths between memory modules and circuitry on the system board.

A portion of a system board 12 is shown with support circuitry needed for implementation of the RAMBUS memory system. A Direct RAMBUS Clock Generator (DRCG) circuit 14, and a master device 16 containing a Direct RAMBUS ASIC Cell (DRAC) 18 are implemented on system board 12. The RAMBUS channel 20 connects DRAC 18 to a first memory socket 22. Socket 22 is physically connected to system board 12. RAMBUS channel 20 connections are generally made by internal printed wiring traces (not shown). First socket 22 generally has a plurality of spring-loaded contacts designed to engage mating contact pads on a first RIMM card 24.

In the RAMBUS architecture, generally 184 contacts are provided on each memory module. RAMBUS channel 20 enters RIMM card 24 at a bus entry region 26 and is then connected to a number of individual memory devices 28 attached to RIMM card 24. The RAMBUS channel next exits RIMM card 24 via a RAMBUS channel exit region 30, and passes from first RIMM card 24 back to system board 12. Additional printed wiring traces carry the RAMBUS channel 20 to a second socket 31 also on system board 12. Second socket 31 holds a second RIMM card 35.

A RAMBUS channel entry portion 32, a series of memory devices 28 and a RAMBUS channel exit portion 34 make up second RIMM card 35. In a similar fashion, a third socket 36, third RIMM card 38, RAMBUS channel entry portion 40, and RAMBUS channel exit portion 42 make up the third RAMBUS memory card. RAMBUS channel 20 reaches terminations 44 at the end of the circuitous routing of the bus 20.

Terminations components, such as resistors, bulk capacitors and/or decoupling capacitors 44 are also placed on system board 12. All RAMBUS channel 20 signals must pass through three sockets 22, 31, 36 and across three RIMM cards 24, 35, 38 before reaching terminations 44. The electrical requirements to reliably access memory devices 28 on the three RIMM cards 24, 35, 38 are stringent. Signal degradation occurs along the path of RAMBUS channel 20, especially at connectors 22, 31, 36. In addition, valuable "real estate" is consumed on the system board 12 itself.

Figure 2A:
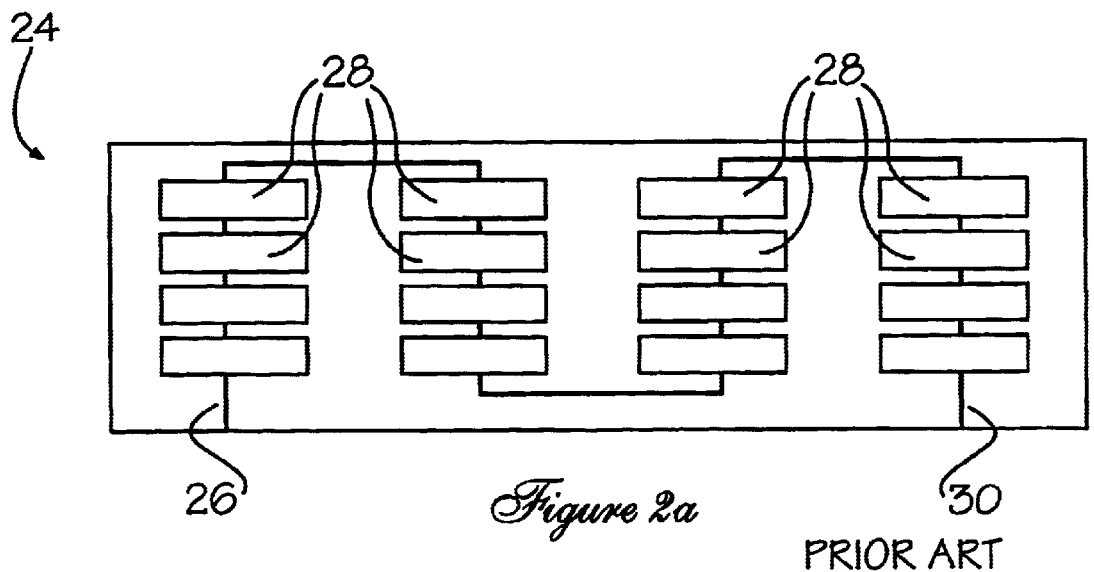
FIG. 2a is a front, plan view of a prior art memory card as shown in FIG. 1.
Figure 2B:
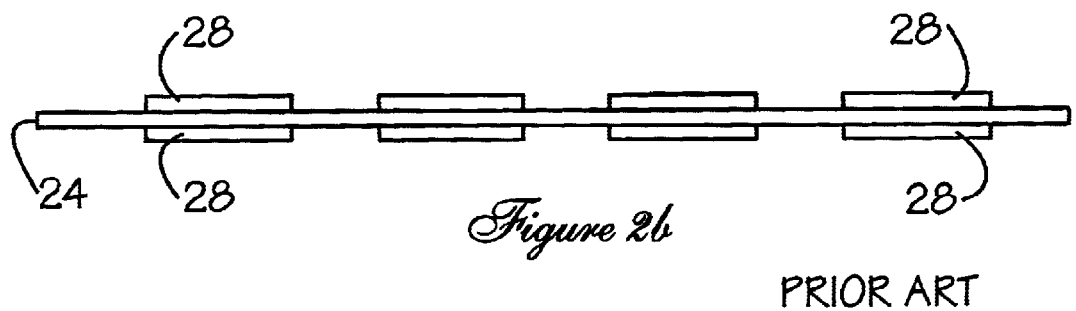
Figure 2C:
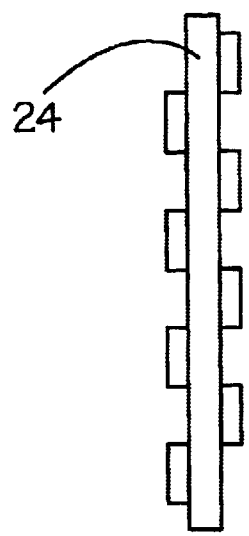

Referring now to FIGS. 2a, 2b, and 2c, there are shown front, top and side views, respectively, of the typical prior art RIMM card 24 shown in FIG. 1. Memory devices 28 are arranged in four vertical rows of four devices each; however, other physical arrangements could also be used. RAMBUS channel 20 (FIG. 1) enters card 24 at a bus entry region 26 and is then connected to memory devices 28. The RAMBUS channel 20 next exits RIMM card 24, via a RAMBUS channel exit region 30, and passes out of first RIMM card 24 and back to system board 12 (FIG. 1).

FIG. 2b is a top view of the RIMM card of FIG. 2a showing memory devices 28 disposed on both sides of RIMM card 24.

FIG. 2c is a side view of the RIMM card of FIG. 2a also showing memory devices 28 disposed on RIMM card 24.

Figure 3:
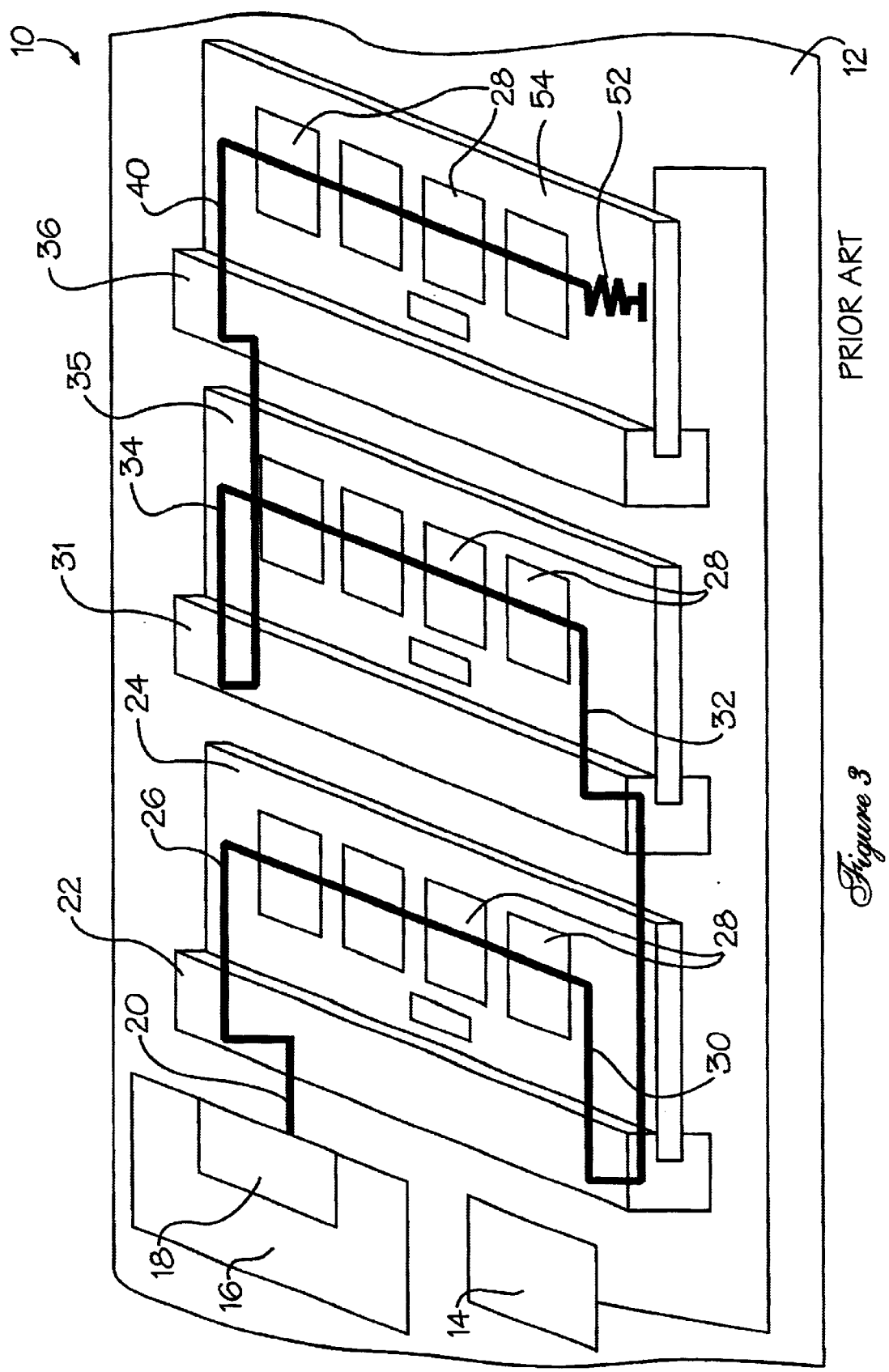
FIG. 3 is a block diagram representation of a memory arrangement of the prior art with bus termination on the last memory module.

Referring now to FIG. 3, there is shown a block diagram of a memory system 10 with the prior art memory module 54 disclosed in U.S. Pat. No. 6,172,895. A portion of a system board 12 is again shown with support circuitry needed for implementation of the RAMBUS memory system. A Direct RAMBUS Clock Generator (DRCG) circuit 14, and a master device 16 containing a Direct RAMBUS ASIC Cell (DRAC) 18 are implemented on system board 12 in the same manner as in the prior art memory card implementation shown in FIG. 1 and discussed hereinabove.

The RAMBUS channel 20 connects DRAC 18 to a memory socket 22. Socket 22 is physically connected to system board 12 and RAMBUS channel 20 connections are generally made by printed wiring traces (not shown) on one or both surfaces of system board 12. Alternately, an internal printed wiring trace (not shown) can be used for connections. Socket 22 generally has a plurality of spring-loaded contacts designed to engage mating contact pads on a RIMM card 24.

RAMBUS channel 20 enters RIMM card 24 at a bus entry region 26 and is then connected to a number of individual memory devices 28 attached to RIMM card 24. The RAMBUS channel 20 then exits RIMM card 24, via a RAMBUS channel exit region 30 and passes out of the first RIMM card 24 and back to system board 12. Additional printed wiring traces carry the RAMBUS channel 20 to a second socket 31 also on system board 12. Second socket 31 holds second RIMM card 35. Similarly, the RAMBUS channel 20 exits the second conventional RIMM card and is connected to the last RIMM card 54, which also contains bus termination 52. Unlike the prior art, terminations 52 are mounted directly on card 54, thereby eliminating the need for an exit portion of RAMBUS channel 30 (FIG. 1). Almost the entire additional set of contacts is thereby eliminated, allowing their use for addressing additional memory capacity or the like.

Referring now to FIG. 4, there is shown a block diagram of prior art memory card system 50 also disclosed in U.S. Pat. No. 6,172,895. A portion of a system board 12 is again shown with support circuitry needed for implementation of the RAMBUS memory system. A Direct RAMBUS Clock Generator (DRCG) circuit 14, and a master device 16 containing a Direct RAMBUS ASIC Cell (DRAC) 18 are implemented on system board 12 in the same manner as in the prior art memory card implementation shown in FIG. 1 and discussed hereinabove.

The RAMBUS channel 20 connects DRAC 18 to a memory socket 22. Socket 22 is physically connected to system board 12 and RAMBUS channel 20 connections are generally made by printed wiring traces (not shown) on one or both surfaces of system board 12. Alternately, an internal printed wiring trace (not shown) can be used for connections. Socket 22 generally has a plurality of spring-loaded contacts designed to engage mating contact pads on a RIMM card 54.

RAMBUS channel 20 enters RIMM card 54 at a bus entry region 56 and is then connected to a number of individual memory devices 28 attached to RIMM card 54. Unlike the prior art of FIG. 1, terminations 52 are mounted directly on card 54, thereby eliminating the need for an exit portion of RAMBUS channel 30 (FIG. 1). The complete, additional set of contacts is also eliminated.

Figure 5A:
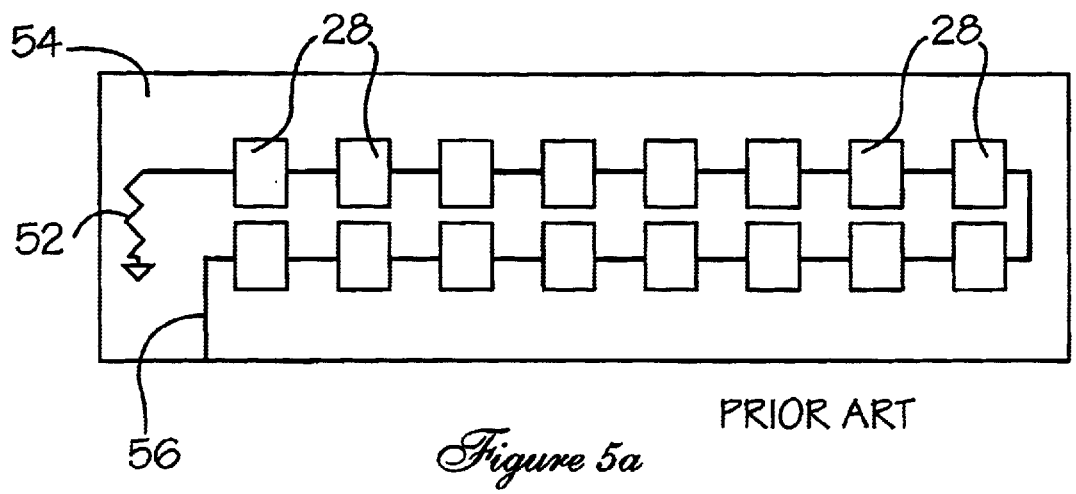
FIG. 5a is a front, plan view of the self-terminating memory card shown in FIG. 4.
Figure 5B:
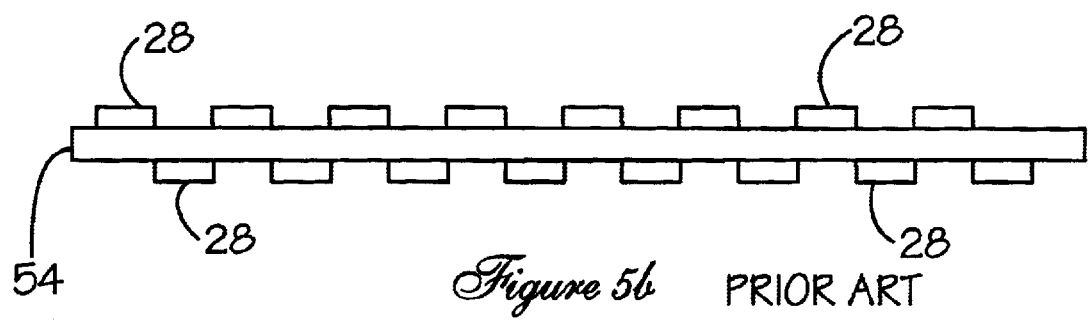
FIG. 5b is a top view of the self-terminating memory card shown in FIG. 4.
Figure 5C:
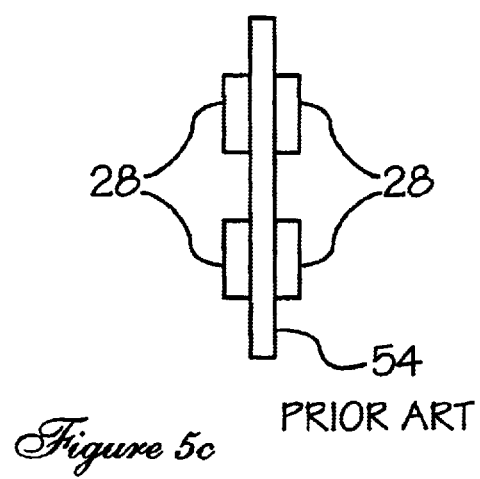
FIG. 5c is an end view of the self-terminating memory card shown in FIG. 4.

Referring now also to FIGS. 5a, 5b and 5c, there are shown front, top and side views, respectively, of a RIMM card 54 having termination on the card as shown in FIG. 4. Memory devices 28 are arranged in two horizontal rows of eight devices each; however, other physical arrangements could also be used. RAMBUS channel 20 (FIG. 4) enters card 54 at a bus entry region 56 and is then connected to memory devices 28. Terminations 52 at the end of the RAMBUS channel 20 (FIG. 4) are also disposed on card 54.

FIG. 5b is a top view of the RIMM card of FIG. 5a showing memory devices 28 disposed on both sides of RIMM card 54.

FIG. 5c is a side view of the RIMM card of FIG. 5a also showing memory devices 28 disposed on RIMM card 54.

The advantages of the inventive configuration are many. Comparing FIG. 1 and FIG. 3, it may be seen that signal degradation in the prior art associated with 2½ connector sockets, signal paths between the slots and the termination are eliminated. Generally, higher memory access speeds may be obtained by improving the quality of the RAMBUS channel (i.e., reducing its length, channel delay, crosstalk, etc.). The reduced path length as well as the elimination of at least one and usually two and one-half sockets between the RIMM card 54 and the terminations 44 (FIG. 1) both help to reduce crosstalk. Additional system board real estate is freed by eliminating the traces between socket 36 (FIG. 1) and terminations 44 (FIG. 1).

These changes improve electromagnetic interference susceptibility and also reduce radiated radio frequency emissions from the system board 12 and RIMM card 54 combination. Another advantage of placing terminations 52 on the memory card 54 is that less noise is coupled into system board 12, potentially enhancing the performance of the entire system.

Figure 6:
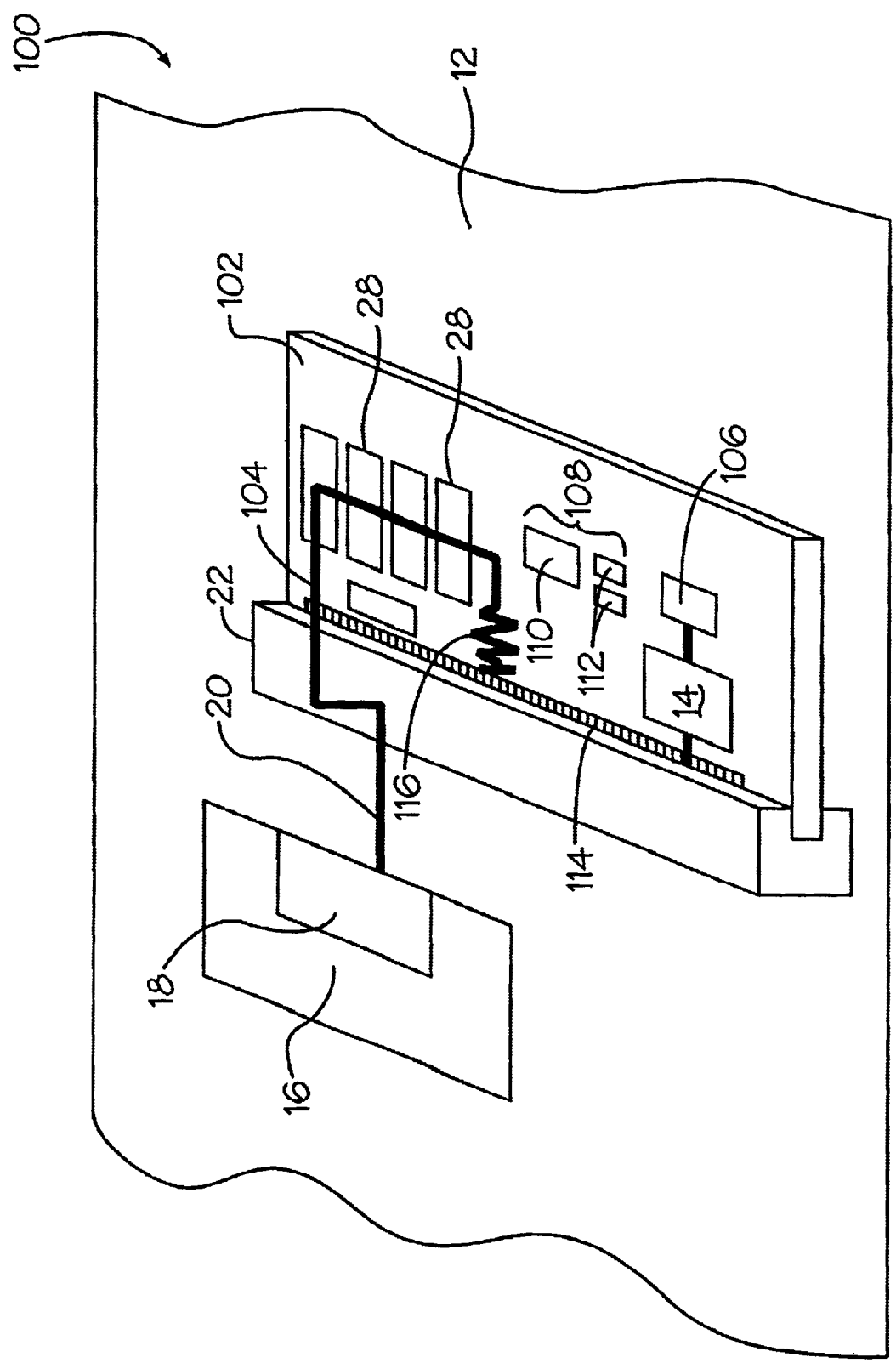
FIG. 6 is a block diagram of a memory arrangement of the present invention including a power supply circuit and a DRCG circuit on the memory module.

Referring now to FIG. 6, there is shown a block diagram of the inventive memory card system 100. A portion of a system board 12 is again shown with some support circuitry, including a master device 16 containing a Direct RAMBUS ASIC Cell (DRAC) 18 needed for implementation of the RAMBUS memory system, as in the prior art memory card implementation shown in FIG. 1 and discussed hereinabove. However, the Direct RAMBUS Clock Generator (DRCG) circuit 14, along with other new features, is now located on inventive module 102.

The RAMBUS channel 20 connects DRAC 18 to a memory socket 22. Socket 22 is physically connected to system board 12 and RAMBUS channel 20 connections are generally made by printed wiring traces (not shown), on one or both surfaces of system board 12. Alternately, an internal printed wiring trace (not shown) can be used for connections. Socket 22 generally has a plurality of spring-loaded contacts designed to engage mating contact pads on a module 102.

RAMBUS channel 20 enters RIMM module 102 at a bus entry region 104 and is then connected to a number of individual memory devices 28 attached to RIMM module 102. Again as in the prior art of FIG. 4, terminations 116 are mounted directly on module 102, thereby eliminating the need for an exit portion of RAMBUS channel 30 (FIG. 1). In this example, terminations 116 comprise a network of resistors and capacitors. The inventive module 102 further includes a power supply circuit 108, which in this case comprises a voltage regulator 110 and any additional filtering 112 required to power the termination components 116. This is beneficial since the RIMM connector specification does not designate the contact(s) necessary for such additional voltages. Element 110 may also be implemented as other circuits such as a DC-to-DC converter.

Module 102 also includes the DRCG device circuit 14, including its associated components that had been located on system board 12 in the prior art examples. When the CTM/CTMN# differential pair of the DRCG circuit is driven from the module, the three input clocks to the DRCG circuit: PCLK/M, SYNCLK/N, and REFCLK all operate at significantly lower frequencies, thereby simplifying the routing of the printed circuit traces for these nets.

The standard RIMM connector 22 does not include connections for the signals such as the clock inputs and power supply inputs needed to operate the DRCG circuit 14. These connections to the DRCG circuit 14 may be made by using some of the existing unused contacts 114 on module 102 and pins (not shown) on the RIMM connector 22. Alternatively, it may be desirable to bring these signals in separately by placing one or more additional interface connectors 106 on the module 102.

Figure 7:
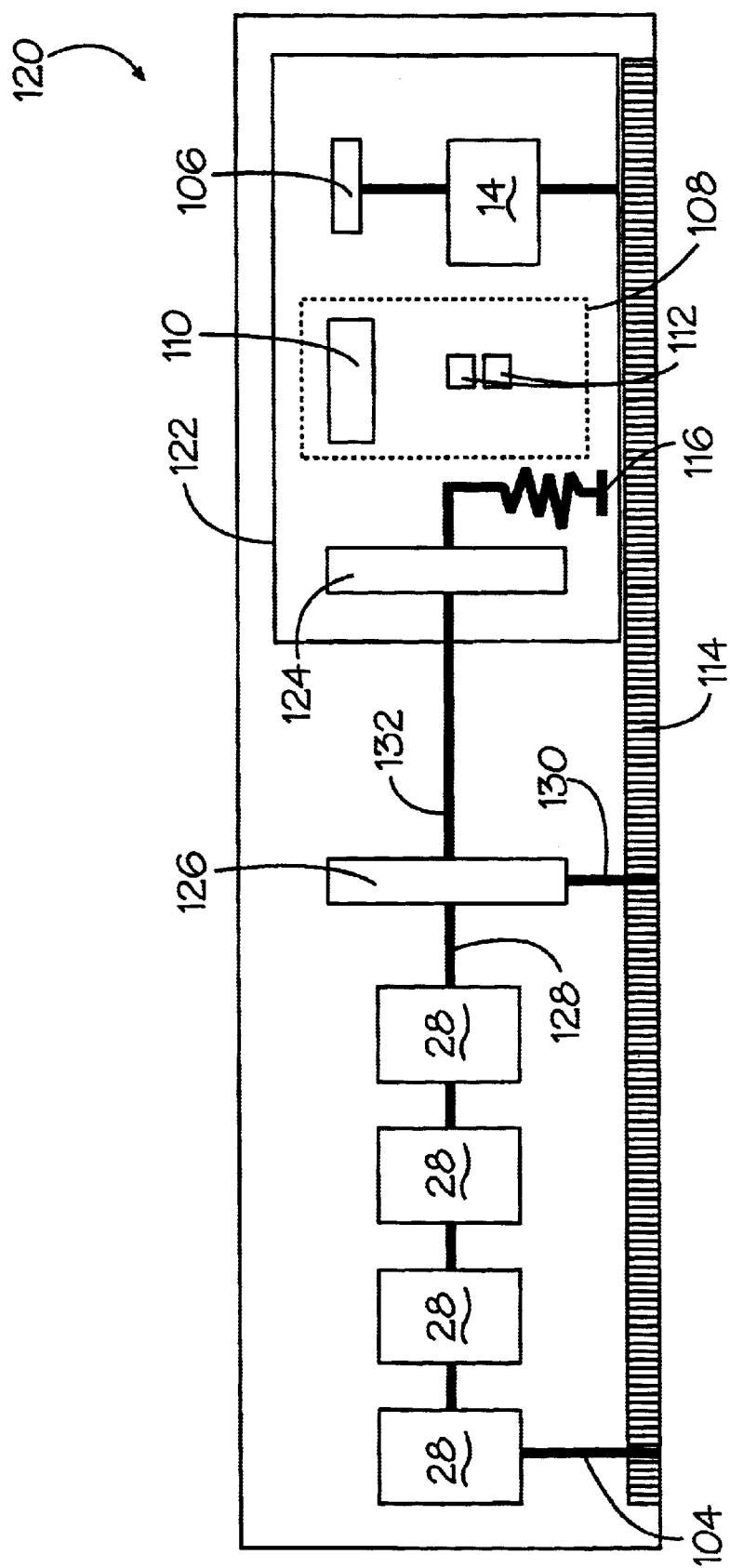
FIG. 7 is a block diagram of an alternate embodiment of a memory module of the present invention including a termination module comprising a bus terminator, a power supply circuit and a DRCG circuit located thereon, connected to the memory module.

Referring now to FIG. 7, there is shown a block diagram of an alternate embodiment of the present invention of a memory module 120 with a separate termination module 122. The termination module 122 comprises bus terminations 116, a power supply circuit 108 and a DRCG circuit 14 located thereon, and is connected to the memory module 120 by connector 124.

Again, since the standard RIMM connector 22 (FIG. 6) does not include connections for the signals such as the clock inputs and power supply inputs needed to operate the DRCG circuit 14, the connections to the DRCG circuit 14 may be made by using some of the existing unused contacts 114 on memory module 120 and pins (not shown) on the RIMM connector 22 (FIG. 6). Alternatively, it may be desirable to bring these clock input and power supply signals in separately by placing one or more additional interface connectors 106 on the termination module 122.

Memory module 120 is shown with optional bus steering means 126, which allows the RAMBUS channel 20 (FIG. 6) to be steered to the termination module 122 or back to RIMM connector 22 (FIG. 6) contacts, as would be found on a standard RIMM module 24 or 35 (FIG. 1). Bus steering means 126 may be implemented in a number of ways. One method is to place a plurality of components such as jumpers or zero-ohm resistors on the module 120 for making the connections necessary to steer the signals of the RAMBUS channel 20.

Another method is to employ jumper blocks and headers to do the necessary bus steering. In one example, RAMBUS channel segment 128, located just after exiting the last memory device 28, may be electrically connected to the center series of pins on a three-position jumper block array, not shown. The pins on one of the edges of the three-position jumper block array are connected to segments 130 to route the RAMBUS channel 20 back to the RIMM connector 22 (FIG. 6). Pins on the opposite edge of the jumper block array are connected to terminations 116 on termination module 122. Two-position headers can then be placed on either side of the jumper block array to make the chosen electrical connections and hence steer the bus. The advantage of this approach is that memory module 120 can be built to operate either as a regular memory module or as one with built-in terminations 116. Each module 120 therefore uses the same substrate but a different set of components can be populated during assembly.

Other methods may also be employed to accomplish the necessary bus steering on memory module 120. One example incorporates solid state switches, providing that the off-isolation of the switches can be maintained at frequencies present in today's memory subsystems. Another example incorporates electromechanical relays, assuming their size would not be prohibitive. The control signal for activating the switches or relays could be implemented by using one of the unused connections on RIMM connector 22 (FIG. 6). Alternatively, a single 3-position jumper with a 2-pin header may be used to switch the control signal to the high or low logic state.

Although the previous embodiments have been shown using a RIMM memory module, the concepts taught also apply to SO-RIMM memory modules as well as other memory package form factors. An alternate form factor of the instant invention is disclosed below and incorporates the stacked memory approach disclosed in one of the referenced copending U.S. patent applications. The benefits of on-card termination, power supplies, and a DRCG circuit are well understood and very desirable for all of the reasons hereinabove. From a manufacturing and logistical point of view, it is equally desirable to have primarily identical memory cards, especially for applications requiring even larger quantities of memory and a low form factor.

Figure 8A:
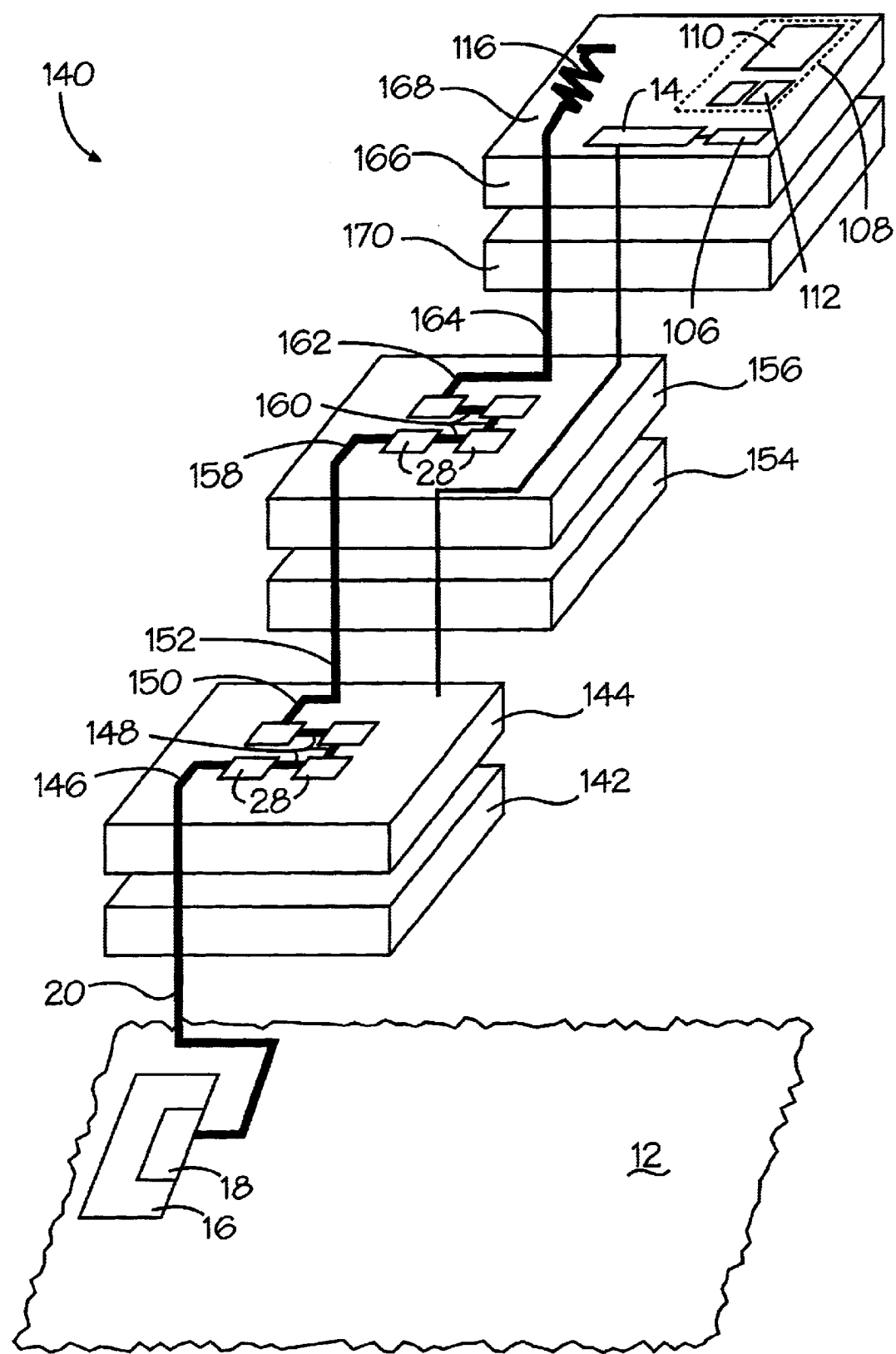
FIG. 8a is a block diagram of another implementation of the invention taught in FIGS. 6 and 7 including a termination module.
Figure 8B:
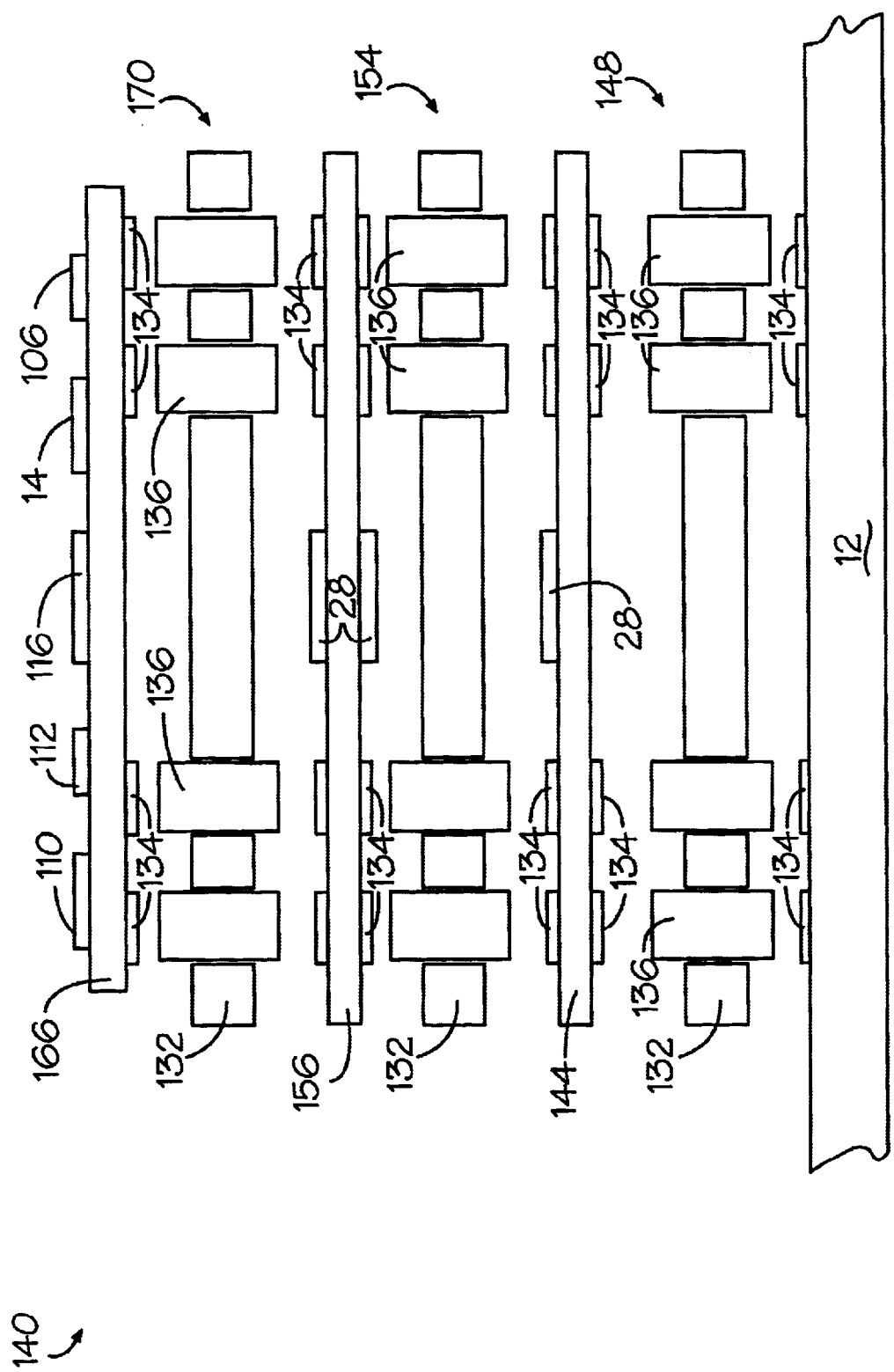

Referring now to FIGS. 8a and 8b, there is shown a block diagram of another implementation of the inventive memory arrangement taught in FIGS. 6 and 7 including a termination module and a cross sectional, enlarged view of the memory arrangement 140 (as shown in FIG. 8a), respectively. A portion of a system board 12 is again shown with some support circuitry, including a master device 16 containing a Direct RAMBUS ASIC Cell (DRAC) 18 needed for implementing the RAMBUS memory system, as in the prior art memory card implementation shown in FIG. 1 and discussed hereinabove. However, the Direct RAMBUS Clock Generator (DRCG) circuit 14, along with other new features, is now located on termination module 166.

The RAMBUS channel segment 20 connects DRAC 18 to an LGA connector 142. Again, RAMBUS channel segment 20 connections are generally made by printed wiring traces (not shown) on one or more of the layers (not shown) of system board 12. LGA connector 142 is disposed between system board 12 and first card 144, and provides electrical interconnection therebetween. LGA connectors 142, 154, and 170 generally have a plurality of short resilient contact members 136 designed to engage mating contact pads 134 on system board 12 and first card 144, and again from first card 144 to second card 156. It is preferable that the housing/carrier 132 of LGA connectors 142, 154, and 170 have a coefficient of thermal expansion (CTE) that closely matches that of the surrounding cards 144, 156.

Contact members 136 are preferably of a construction and composition as taught in one of the referenced copending U.S. patent applications and further enhanced electrically and mechanically by the teachings of other copending U.S. patent applications. Compared to prior art pin-and-socket LGA connectors, connectors 142, 154, and 170 of the present invention provide improved performance, increased density, lower height, and a CTE that better matches the surrounding structures. Also, due to the lower force per contact required by connectors 142, 154, and 170, the number of contacts allowed for a given amount of retention force significantly increases.

RAMBUS channel segment 20 enters first card 144 at a bus entry region 146 and is then connected to a number of individual memory devices 28 attached to card 144 through device connection segments 148. The RAMBUS channel next exits card 144 via a RAMBUS channel exit region 150. RAMBUS channel segment 152 passes from first card 144 directly to second card 156 through LGA connector 154 instead of back through system board 12.

A RAMBUS channel entry portion 158, a series of memory devices 28, a series of device connection segments 160, and a RAMBUS channel exit portion 162, make up second card 156. RAMBUS channel segment 164 reaches terminations 116 on termination module 166 after passing through connector 170 and RAMBUS channel entry portion 168. Termination module 166 also includes a power supply circuit 108 and a DRCG circuit 14 located thereon.

Cards 144, 156, and 166 typically are printed circuit structures, comprising epoxy-glass-based materials (i.e., FR4) and include one or more conductive (i.e., signal, power and/or ground) layers therein. Other materials may be used for various reasons, including electrical performance, wirability, and thermal performance, but epoxy-glass-based materials are cost-effective and have a CTE that matches that of system board 12 and LGA connectors 142 and 154. Again due to the stringent RAMBUS electrical specifications, the signal traces must match the system impedance within ten percent.

In the present embodiment, since a retentive force is not inherent as in a pin-and-socket type interconnection, a clamping mechanism creates the force necessary to ensure each contact member 136 of connectors 142, 154 and 170 is compressed an appropriate amount during engagement to form the required interconnections to the circuit elements. It is preferable that the clamping mechanism not require any mounting holes in system board 12, provide a controlled and uniform displacement of force over the array of contact members 136, avoid problems with CTE mismatches, and be field separable to facilitate repairs and upgrades by the end user.

Although means for clamping and aligning cards 144, 156, 166 to system board 12 has not been shown specifically in this embodiment, it should be readily apparent to those skilled in the art that many devices and methods may be implemented.

Figure 9B:
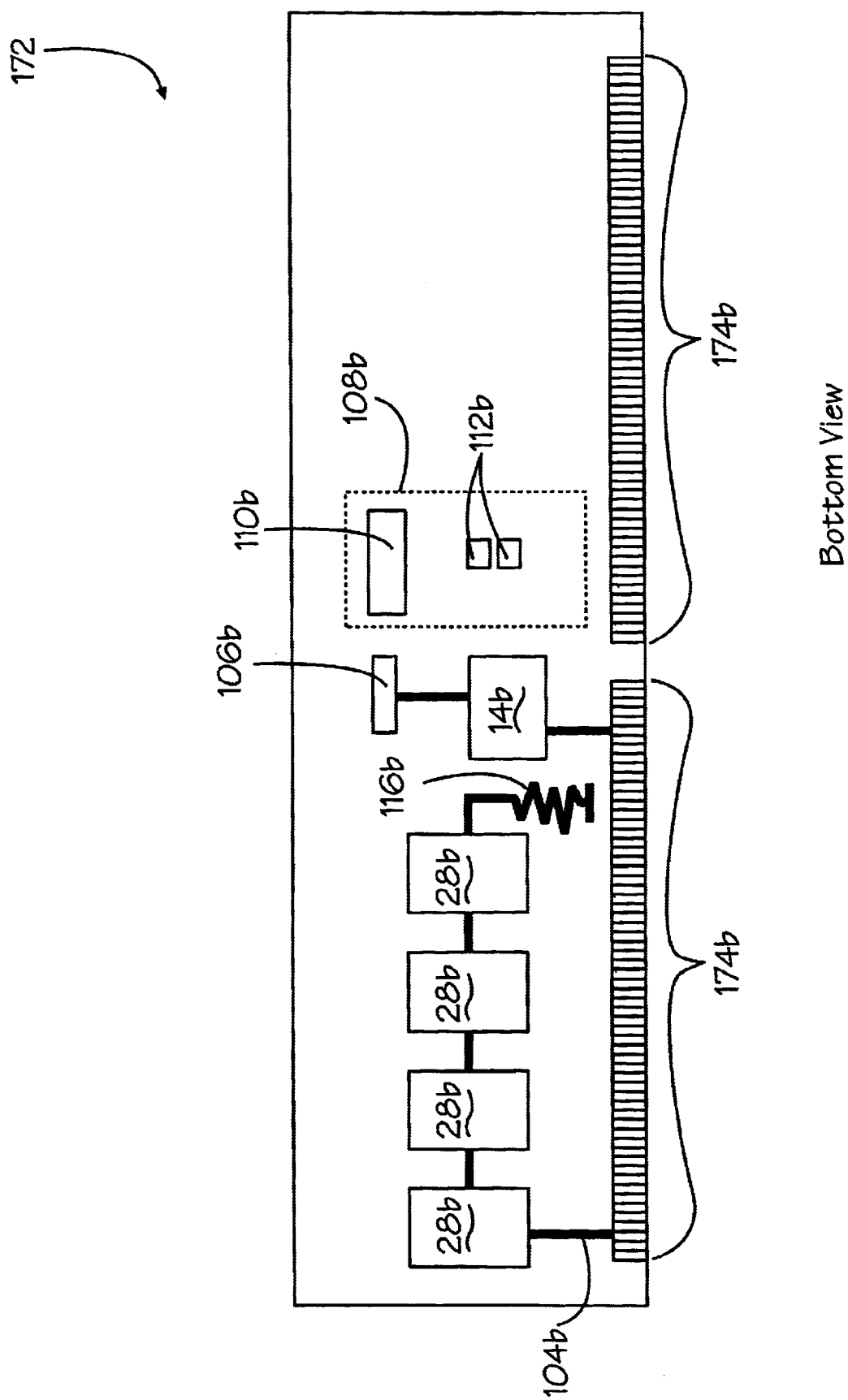

Referring now to FIGS. 9a and 9b, there are shown front and back block diagrams of the memory module taught in FIG. 6 in a multi-memory channel configuration. First RAMBUS channel 20a enters RIMM module 172 at a bus entry region 104a and is then connected to a number of individual memory devices 28a attached to RIMM module 172. Again as in the prior art of FIG. 4, terminations 116a are mounted directly on module 172, thereby eliminating the need for an exit portion of RAMBUS channel 30 (FIG. 1). Bus entry region 104a uses half of the available contacts 174a. The other half of the contact 174b are used by entry region 104b for the second RAMBUS channel (FIG. 9b).

The inventive module 172 further includes a power supply circuit 108a, which in this case comprises a voltage regulator 110a and any additional filtering 112a required to power the termination components 116a. This is beneficial since the RIMM connector specification does not designate the contact(s) necessary for such additional voltages. Module 172 also includes the DRCG device circuit 14a, including its associated components that had been located on system board 12 in the prior art examples.

The standard RIMM connector 22 does not include connections for the signals such as the clocks inputs and power supply inputs needed to operate the DRCG circuit 14a. These connections to the DRCG circuit 14a may be made by using some of the existing unused contacts 174a on module 172 and pins (not shown) on the RIMM connector 22. Alternatively, it may be desirable to bring these signals in separately by placing one or more additional interface connectors 106a on the module 172.

Referring now to FIG. 9b, second RAMBUS channel 20b enters RIMM module 172 at a bus entry region 104b and is then connected to a number of individual memory devices 28b attached to RIMM module 172. Again as in the prior art of FIG. 4, terminations 116b are mounted directly on module 172, thereby eliminating the need for an exit portion of RAMBUS channel 30 (FIG. 1). Bus entry region 104b uses the other half of the available contacts 174b.

The inventive module 172 further includes a power supply circuit 108b, which in this case comprises a voltage regulator 110b and any additional filtering 112b required to power the termination components 116b. Again, this is beneficial since the RIMM connector specification does not designate the contact(s) necessary for such additional voltages. Module 172 also includes the DRCG device circuit 14b, including its associated components that had been located on system board 12 in the prior art examples.

The standard RIMM connector 22 does not include connections for the signals such as the clock inputs and power supply inputs needed to operate the DRCG circuit 14b. These connections to the DRCG circuit 14b may be made by using some of the existing unused contacts 174b on module 172 and pins (not shown) on the RIMM connector 22. Alternatively, it may be desirable to bring these signals In separately by placing one or more additional interface connectors 106b on the module 172.

It should be understood that for certain applications, not all of the inventive features may be required. For example, a module may require an on-module DRCG circuit, but may not require on-module termination.

Since other modifications and changes varied to fit particular operating requirements and environments will be apparent to those skilled in the art, this invention is not considered limited to the example chosen for purposes of this disclosure, and covers all changes and modifications which does not constitute departures from the true spirit and scope of this invention.

Having thus described the invention, what is desired to be protected by Letters Patent is presented in the subsequently appended claims.

What is claimed is:

1. A self-terminating, high frequency memory module, comprising:
   a) a substrate;
   b) a plurality of electrical contacts disposed on at least one surface of said substrate adapted to connect to an external memory bus;
   c) electrical connection means operatively connected to said plurality of electrical contacts forming an extension of said external memory bus;
   d) a plurality of memory devices mounted on said substrate selectively connected to said memory bus extension;
   e) bus termination means operatively connected to said memory bus extension; and
   f) a power supply circuit to provide power to said bus termination means.

2. The self-terminating, high-frequency memory module as recited in claim 1, wherein said external memory bus comprises a characteristic impedance and said bus termination includes an impedance network that exhibits an impedance substantially matching said characteristic impedance.

3. The self-terminating, high frequency memory module as recited in claim 2, wherein said bus terminating means comprises at least one from the group of resistors, capacitors and inductors disposed on said substrate and electrically connected to lines of said memory bus extension.

4. The self-terminating, high frequency memory module as recited in claim 1, wherein said power supply circuit comprises a voltage regulator device.

5. The self-terminating, high frequency memory module as recited in claim 4, wherein said power supply circuit further comprises a capacitor.

6. The self-terminating, high frequency memory module as recited in claim 1, wherein said power supply circuit comprises a DC-to-DC converter circuit.

7. The self-terminating, high frequency memory module as recited in claim 1, further comprising at least one component integral to a memory control subsystem mounted on said substrate.

8. The self-terminating, high frequency memory module as recited in claim 7, wherein said at least one component integral to a memory control subsystem comprises a clock generator circuit.

9. The self-terminating, high frequency memory module as recited in claim 8, wherein said clock generator circuit is a Direct RAMBUS Clock Generator (DRCG) circuit.

10. The self-terminating, high frequency memory module as recited in claim 1, further comprising bus steering means connected between said memory bus extension and said bus termination means.

11. The self-terminating, high frequency memory module as recited in claim 10, wherein said bus steering means comprises a plurality of jumpers.

12. The self-terminating, high frequency memory module as recited in claim 10, wherein said bus steering means comprises a plurality of resistors.

13. The self-terminating, high frequency memory module as recited in claim 12, wherein said resistors have a value of approximately zero ohms.

14. The self-terminating, high frequency memory module as recited in claim 10, wherein said bus steering means comprises a jumper block.

15. The self-terminating, high frequency memory module as recited in claim 10, wherein said bus steering means comprises a plurality of solid state switches.

16. The self-terminating, high frequency memory module as recited in claim 10, wherein said bus steering means comprises a plurality of electromechanical relays.

17. The self-terminating, high frequency memory module as recited in claim 1, wherein said external memory bus comprises at least two external memory buses; said extension of said external memory bus comprises at least two extensions of said at least two memory buses; and said plurality of memory devices comprises at least two groups of memory devices, each group being independently connected to one of said at least two memory bus extensions.

18. A high frequency memory module, comprising:
a) a substrate;
b) a plurality of electrical contacts disposed on at least one surface of said substrate adapted to connect to an external memory bus;
c) electrical connection means operatively connected to said plurality of electrical contacts forming an extension of said external memory bus;
d) a plurality of memory devices mounted on said substrate selectively connected to said memory bus extension; and
e) at least one component integral to a memory control subsystem mounted on said substrate.

19. The high-frequency memory module as recited in claim 18, wherein said external memory bus comprises a characteristic impedance.

20. The high frequency memory module as recited in claim 19, wherein said at least one component integral to a memory control subsystem comprises a Direct RAMBUS Clock Generator (DRCG) circuit.

21. The high frequency memory module as recited in claim 18, further comprising bus termination means operatively connected to said memory bus extension.

22. The high frequency memory module as recited in claim 21, further comprising bus steering means connected between said memory bus extension and said bus termination means.

23. The high frequency memory module as recited in claim 22, wherein said bus steering means comprises one of the group of jumpers, resistors, zero-ohm resistors, jumper blocks, solid state switches, and electromechanical relays.

24. The high frequency memory module as recited in claim 18, wherein said external memory bus comprises at least two external memory buses; said extension of said external memory bus comprises at least two extensions of said at least two memory buses; and said plurality of memory devices comprises at least two groups of memory devices, each group being independently connected to one of said at least two memory bus extensions.

25. A termination module for high frequency buses, comprising:
a) a substrate;
b) a plurality of electrical contacts disposed on at least one surface of said substrate adapted to connect to an external bus;
c) electrical connection means operatively connected to said plurality of electrical contacts forming an extension of said external bus;
d) bus termination means operatively connected to said bus extension; and
e) a power supply circuit to provide power to said bus termination means.

26. The termination module for high frequency buses as recited in claim 25, wherein said external bus comprises a characteristic impedance and said bus termination includes an impedance network that exhibits an impedance substantially matching said characteristic impedance.

27. The termination module for high frequency buses as recited in claim 26, wherein said bus terminating means comprises at least one from the group of resistors, capacitors and inductors disposed on said substrate and electrically connected to lines of said bus extension.

28. The termination module for high frequency buses as recited in claim 25, wherein said power supply circuit comprises a voltage regulator device.

29. The termination module for high frequency buses as recited in claim 28, wherein said power supply circuit further comprises a capacitor.

30. The termination module for high frequency buses as recited in claim 25, wherein said power supply circuit comprises a DC-to-DC converter circuit.

31. The termination module for high frequency buses as recited in claim 25, further comprising at least one component integral to a control subsystem mounted on said substrate.

32. The termination module for high frequency buses as recited in claim 31, wherein said control subsystem is a memory control system.

33. The termination module for high frequency buses as recited in claim 32, wherein said at least one component integral to a control subsystem comprises a Direct RAMBUS Clock Generator (DRCG) circuit.

34. The termination module for high frequency buses as recited in claim 25, wherein said external bus comprises at least two external buses and said extension of said external bus comprises at least two extensions of said at least two buses.

* * * * *